(12) United States Patent
Okamoto (10) Patent No.: US 7,985,637 B2
(45) Date of Patent: Jul. 26, 2011

(54) MANUFACTURING METHOD FOR COMPOUND SEMICONDUCTOR DEVICE AND ETCHING SOLUTION

(75) Inventor: Naoya Okamoto, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 442 days.

(21) Appl. No.: 12/207,085

(22) Filed: Sep. 9, 2008

(65) Prior Publication Data
US 2009/0061576 A1    Mar. 5, 2009

Related U.S. Application Data

(63) Continuation of application No. PCT/JP2006/304795, filed on Mar. 10, 2006.

(51) Int. Cl.
*H01L 21/338* (2006.01)
(52) U.S. Cl. ............... 438/167; 438/172; 257/E21.403
(58) Field of Classification Search .............. 438/167, 438/172, 590; 257/E21.403, E21.407
See application file for complete search history.

(56) References Cited

U.S. PATENT DOCUMENTS

| | | | |
|---|---|---|---|
| 7,459,356 B1 * | 12/2008 | Smart et al. ............. | 438/172 |
| 2004/0264533 A1 | 12/2004 | Matsumura et al. | |

FOREIGN PATENT DOCUMENTS

| JP | 08-213358 A | 8/1996 |
|---|---|---|
| JP | 10-189480 A | 7/1998 |
| JP | 2005-33099 A | 2/2005 |
| JP | 2005-136002 A | 5/2005 |

OTHER PUBLICATIONS

International Search Report of PCT/JP2006/304795, date of mailing May 30, 2006.
J. A. Bardwell et al.; "Ultraviolet photoenhanced wet etching of GaN in K2S2O8 Solution", Journal of Applied Physics, vol. 89, No. 7, Apr. 1, 2001, pp. 4142-4149. Cited in the ISR.
Z. H. Hwang et. al.: "Electrodeless wet etching of GaN assisted with chopped ultraviolet light" Applied Physics Letters, vol. 84, No. 19, May 10, 2004.
C. Youtsey et. al., "Smooth n-type GaN surfaces by photoenhanced wet etching" Applied Physics Letters, vol. 72, No. 5, Feb. 2, 1998.
C. Youtsey et. al., "Highly anisotropic photoenhanced wet etching of n-type GaN" Applied Physics Letters, vol. 71, No. 15, Oct. 13, 1997.
Notification of Transmittal of Translation of the International Preliminary Report on Patentability (Form PCT/IB/338) of International Application No. PCT/JP2006/304795 mailed Sep. 25, 2008 with Forms PCT/IB/373 and PCT/ISA/237.

* cited by examiner

*Primary Examiner* — Hoai v Pham
(74) *Attorney, Agent, or Firm* — Westerman, Hattori, Daniels & Adrian, LLP (57) ABSTRACT

After an n-type AlGaN barrier layer (3) is formed over a substrate (1), an n-type GaN contact layer (4) is formed over the n-type AlGaN barrier layer (3). Next, the n-type GaN contact layer (4) is wet-etched with using an etching solution containing an organic alkali agent and an oxidizer while the n-type GaN contact layer (4) is irradiated with an ultraviolet illumination.

16 Claims, 9 Drawing Sheets

FIG. 4B

MANUFACTURING METHOD FOR COMPOUND SEMICONDUCTOR DEVICE AND ETCHING SOLUTION

CROSS-REFERENCE TO RELATED APPLICATIONS

This application is a Continuation of International Application No. PCT/JP2006/304795, with an international filing date of Mar. 10, 2006, which designating the United States of America, the entire contents of which are incorporated herein by reference.

FIELD

The present invention relates to a manufacturing method for a compound semiconductor device and an etching solution which are suitable for manufacturing a high electron mobility transistor (HEMT).

BACKGROUND

Figure 2:
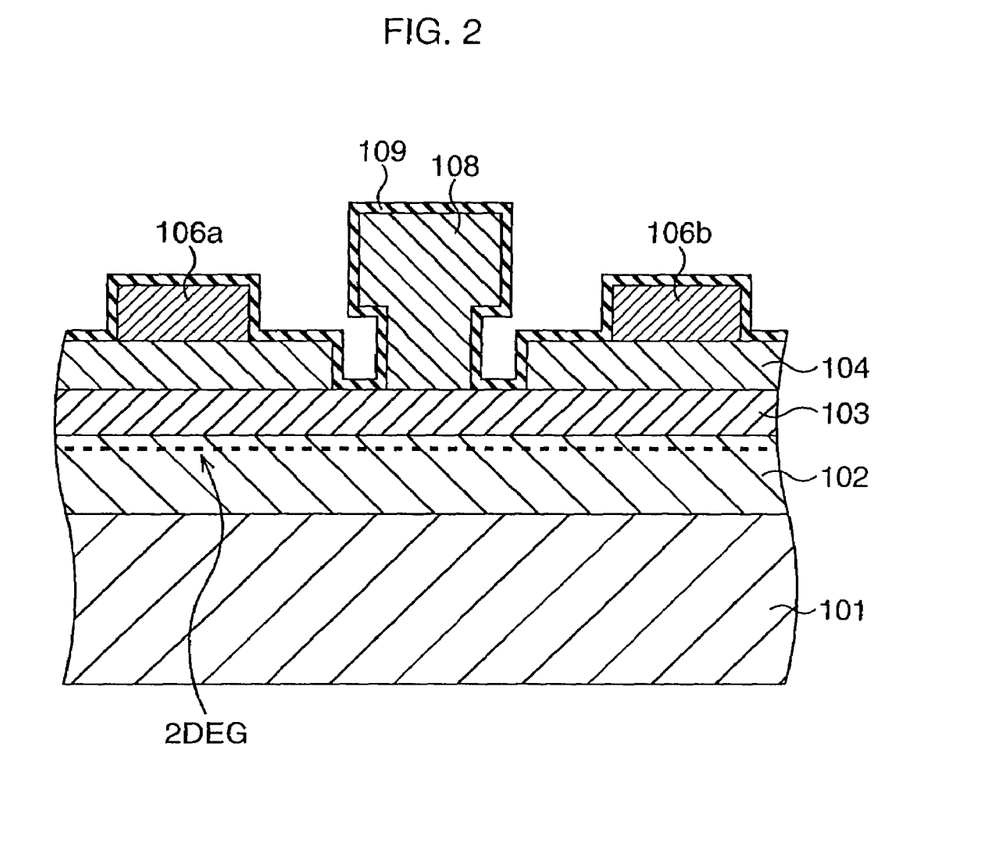
FIG. 2 is a cross-sectional view showing a compound semiconductor device adopting a recess structure for a gate.

In recent years, gallium nitride (GaN)-based electronic device has been considered as a promising high breakdown voltage/high speed device because of its physical characteristic. Researches on its manufacturing technique, application technique, and the like have been in progress. Generally, in order to improve a high-speed characteristic of a GaN-based electronic device, adopting a recess structure as a gate as shown in FIG. 2 is thought to be effective.

To form the recess structure, a GaN channel layer 102 and an AlGaN carrier supply layer 103 are sequentially formed on a substrate 101, and an n-type GaN layer 104 is further formed on the entire surface, and thereafter is dry-etched. Thereafter, a source electrode 106a, a drain electrode 106b, a gate electrode 108, and a SiN film 109 are formed. However, the n-type GaN layer 104, the AlGaN carrier supply layer 103, the GaN channel layer 102, and so on are easily damaged by the dry etching.

A possible method for avoiding such damage is wet etching. For example, Appl. Phys. Lett. 71 (1977) 2151-2153, Appl. Phys. Lett. 72 (1998) 560-562, J. Appl. Phys. 89 (2001) 4142-4149, Appl. Phys. Lett. 84 (2004) 3759-3761 disclose methods of wet-etching a GaN layer.

Figure 3A:
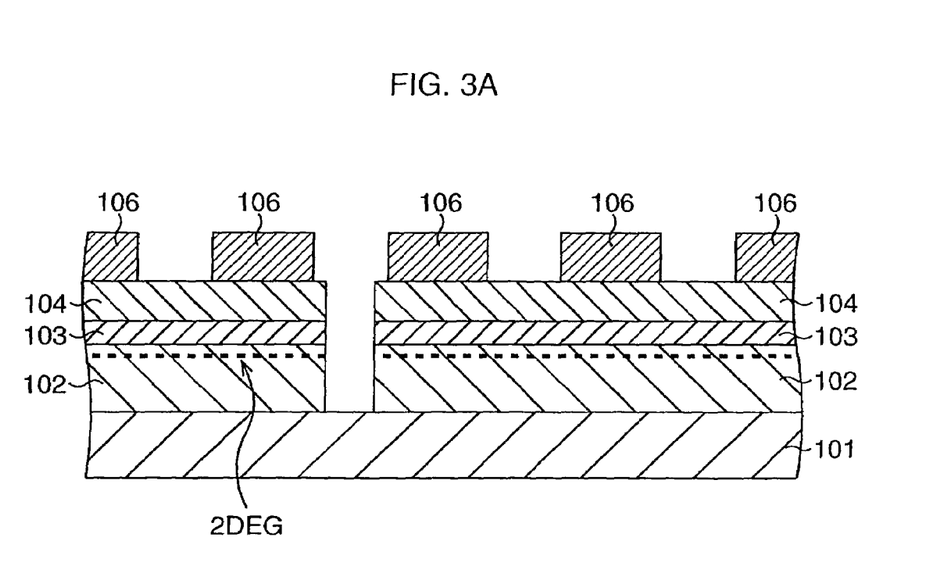
FIGS. 3A and 3B are cross sectional views showing a conventional manufacturing method for a compound semiconductor device.
Figure 3B:
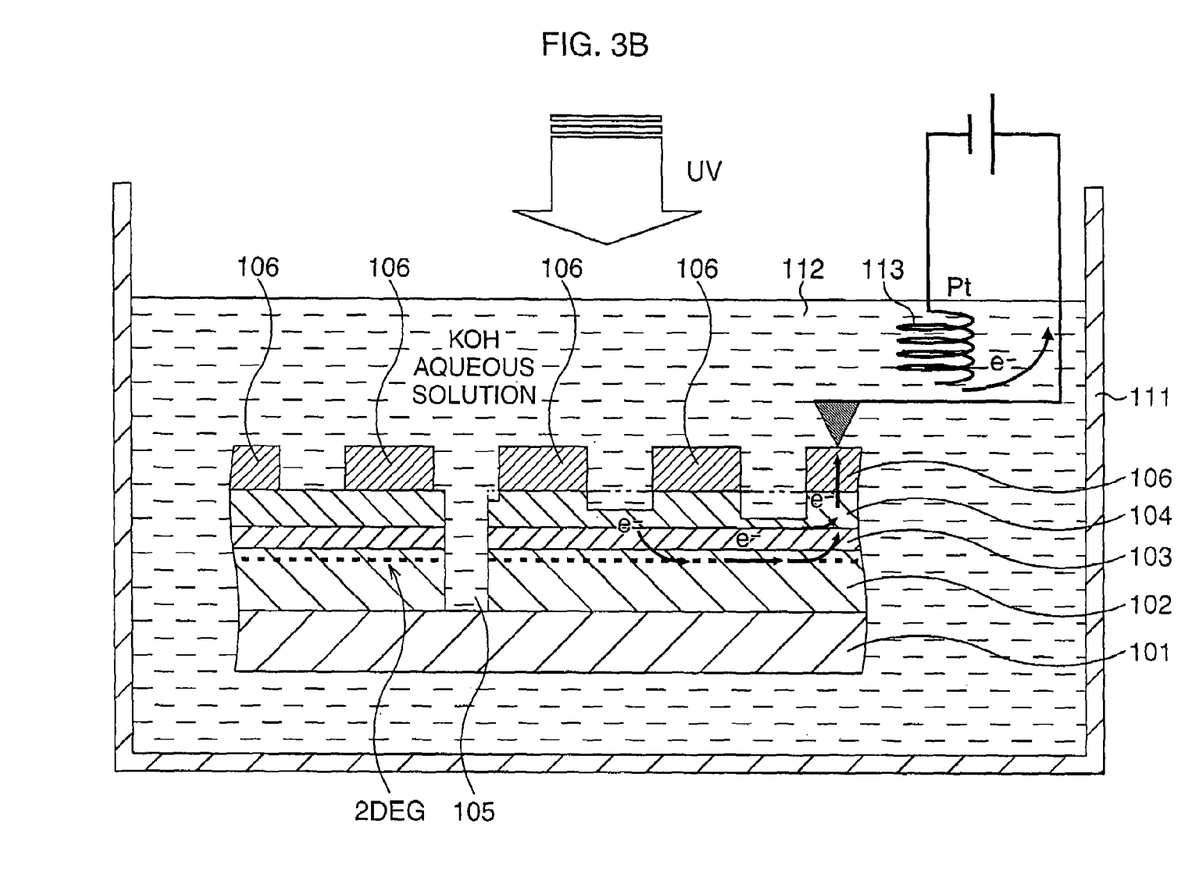

In the methods described in Appl. Phys. Lett. 71 (1977) 2151-2153, and Appl. Phys. Lett. 72 (1998) 560-562, a compound semiconductor wafer on which ohmic electrodes 106 are formed is first fabricated as shown in FIG. 3A. Then, as shown in FIG. 3B, the compound semiconductor wafer is immersed in a potassium hydroxide (KOH) aqueous solution 112 in a tank 111. Then, a Pt electrode 113 is put in the KOH aqueous solution 112 and a bias is applied, with a part of the ohmic electrodes 106 serving as an anode and the Pt electrode 113 serving as a cathode. Further, an n-type GaN layer 104 is irradiated with an ultraviolet illumination (UV).

Figure 4A:
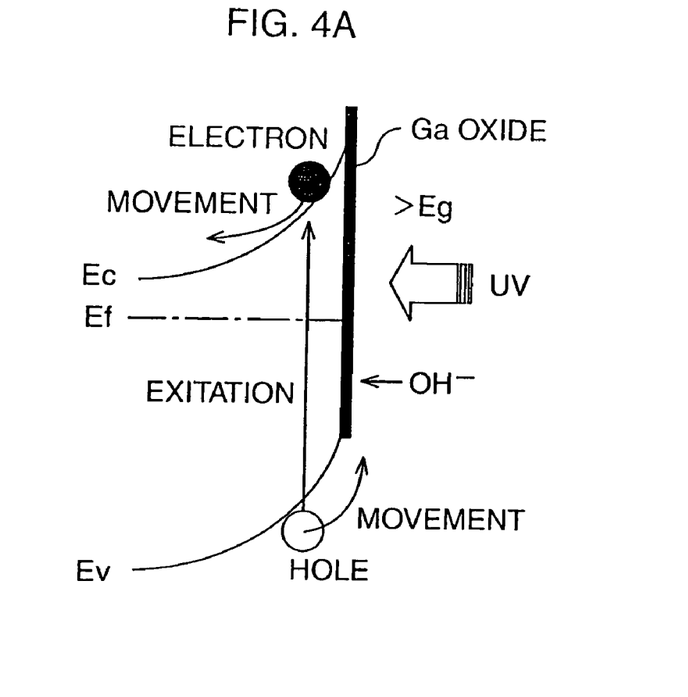
FIGS. 4A and 4B are band diagrams showing a state of electric charge in a part to which a bias is applied.

As a result, electron-hole pairs are generated on a surface of the n-type GaN layer 104 as shown in FIG. 4A. Then, the electrons move toward the Pt electrode 113 via the ohmic electrodes 106, and the holes bind with OH$^-$ ions in the KOH aqueous solution 112 on the surface of the n-type GaN layer 104. In this manner, the oxidation and dissolution of the surface of the n-type GaN layer 104 are repeated, so that the wet etching progresses.

Figure 4B:
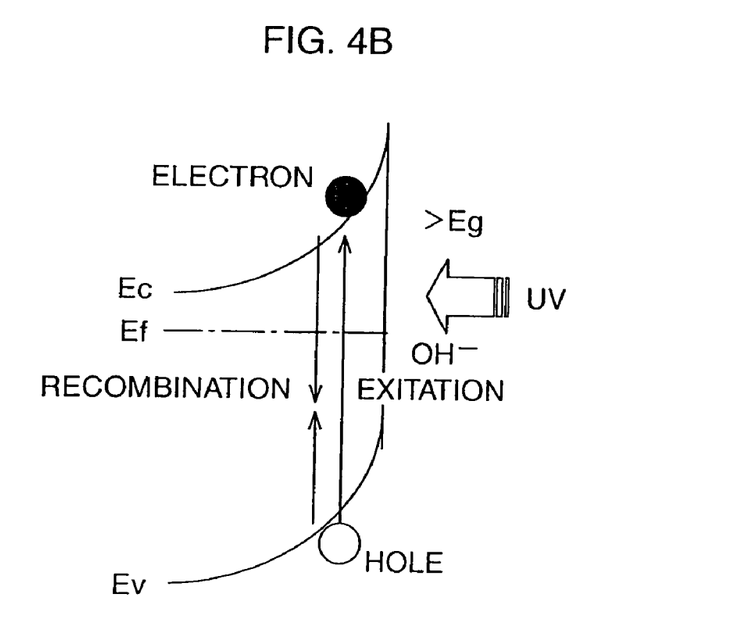

However, in such wet etching using the ultraviolet illumination, it is important to move the electrons from the surface of the n-type GaN layer 104 with preventing the electrons excited by the ultraviolet illumination from recombination with the holes. Further, in order to reduce variation among electronic devices, uniform processing in a wafer is also important. In the above-described method, however, a resistance present in the n-type GaN layer 104 causes variation in strength of an electric field depending on a distance from the points to which the bias is applied. Consequently, there occurs a difference in velocity of the electrons, which is likely to cause variation in etching depth in the wafer. Further, when element isolation regions 105 exist as shown in FIG. 3B, there exist regions to which no bias is applied. These regions are not etched since the electrons do not move therein as shown in FIG. 4B. Further, in the GaN-based compound semiconductor device, aluminum (Al) electrodes are generally used as the ohmic electrodes, and there is a problem that Al is easily corroded by the KOH aqueous solution.

Figure 5:
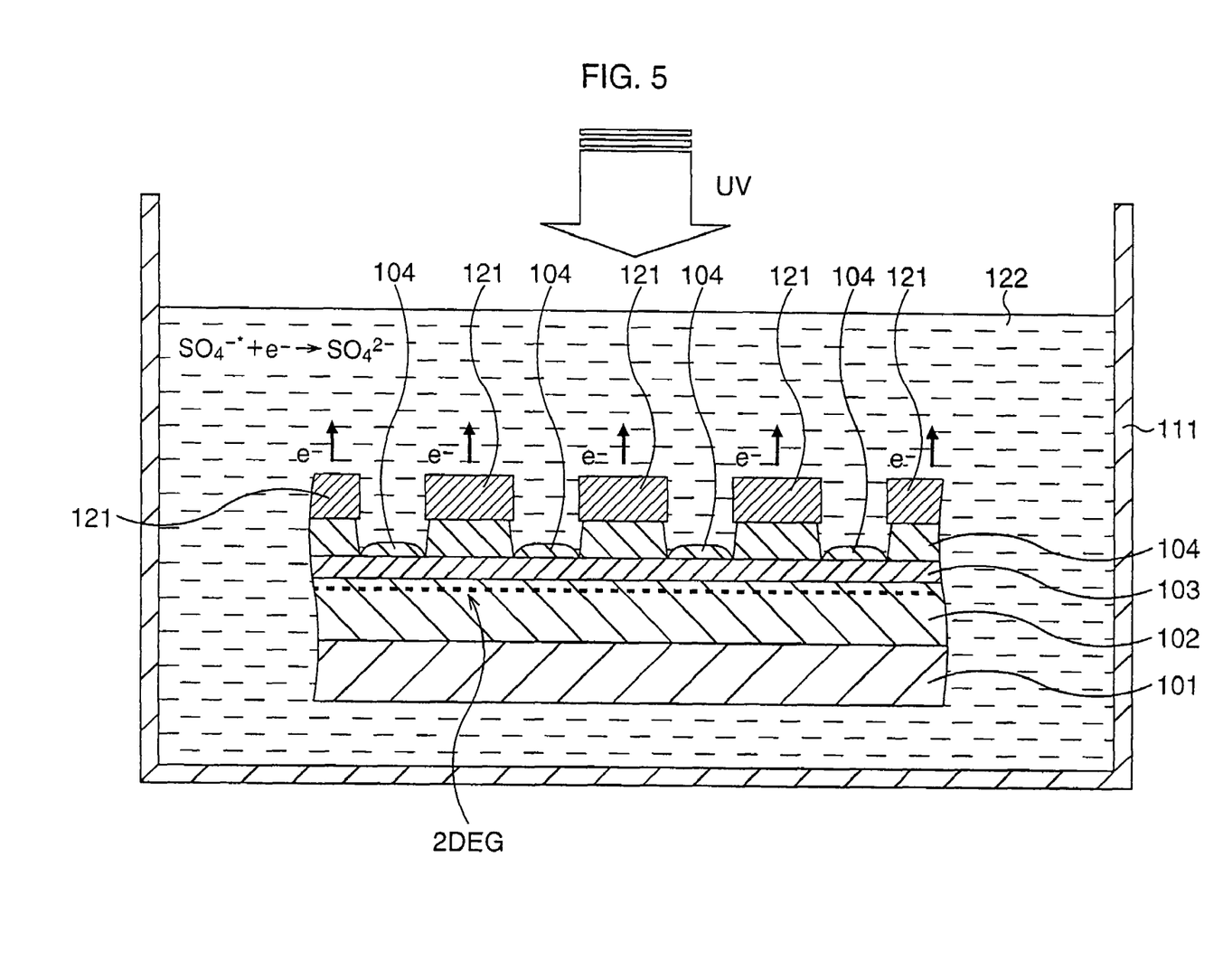
FIG. 5 is a cross-sectional view showing another conventional manufacturing method for a compound semiconductor device.

In the methods described in J. Appl. Phys. 89 (2001) 4142-4149, and Appl. Phys. Lett. 84 (2004) 3759-3761, as shown in FIG. 5, a compound semiconductor wafer is immersed in a mixed solution 122 of a KOH aqueous solution and a potassium peroxodisulfate ($K_2S_2O_8$) aqueous solution, and the n-type GaN layer 104 is irradiated with an ultraviolet illumination. This method includes no bias application. In this method, the etching of the n-type GaN layer 104 progresses since electrons excited by the irradiation of the ultraviolet illumination move toward photodissociated sulfate active ions $SO_4^{-*}$ of peroxodisulfate ions $S_2O_8^{2-}$. Further, in this method, a mask 121 made of metal such as platinum or titanium is used as an etching mask. This is intended to make it easy for the electrons induced by the irradiation of the ultraviolet illumination to flow into the sulfate active ions in the etching solution via the metal mask 121.

However, in this conventional method, the easiness with which the electrons flow into the sulfate active ions is not uniform. Specifically, since this flow of the electrons easily occurs in the vicinity of an end surface of the metal mask 121, the etching rate in this area is higher than the etching rate in an area distant from the metal mask 121. As a result, the etching rate becomes non-uniform, resulting in uneven etching as shown in FIG. 5.

Further, when the metal mask 121 is used, prior to the formation of the ohmic electrodes, the metal mask 121 has to be removed after the wet etching. However, the removal of the metal mask 121 is very difficult. Therefore, an etched surface is sometimes contaminated with the metal. In this case, a yield is lowered.

Using a $SiO_2$ film, which is an insulation film, as the etching mask is also described as an example, but this also lowers the yield similarly to the use of the metal mask 121 since the processing and removal of the $SiO_2$ film are complicated.

Further, the KOH aqueous solution and the $K_2S_2O_8$ aqueous solution both have high concentration (about 0.1 mol/liter). Therefore, morphology of the etched surface is low. Further, in another effort to use the ohmic electrodes as the metal mask 121, a resist mask itself necessary to protect the ohmic electrodes cannot resist the mixed solution 122. Therefore, the ohmic electrodes cannot be formed before the wet etching.

As described above, it has been conventionally difficult to process an n-type GaN layer by wet etching.

SUMMARY

An aspect of the present invention includes a manufacturing method for a compound semiconductor device having, forming a GaN-based first compound semiconductor layer over a substrate; forming a GaN-based second compound semiconductor layer over the first compound semiconductor layer; and wet-etching the second compound semiconductor layer with using an etching solution containing an organic alkali agent and an oxidizer while irradiating the second compound semiconductor layer with an ultraviolet illumination.

Additional objects and advantages of the invention will be set forth in part in the description which follows, and in part will be obvious from the description, or may be learned by practice of the invention. The object and advantages of the invention will be realized and attained by means of the elements and combinations particularly pointed out in the appended claims.

It is to be understood that both the foregoing general description and the following detailed description are exemplary and explanatory only and are not restrictive of the invention, as claimed.

DESCRIPTION OF EMBODIMENTS

Hereinafter, embodiments of the present invention will be concretely described with reference to the accompanying drawings. FIG. 1A to FIG. 1G are cross-sectional views showing, in order of processes, a manufacturing method for a compound semiconductor device according to an embodiment of the present invention.

Figure 1A:
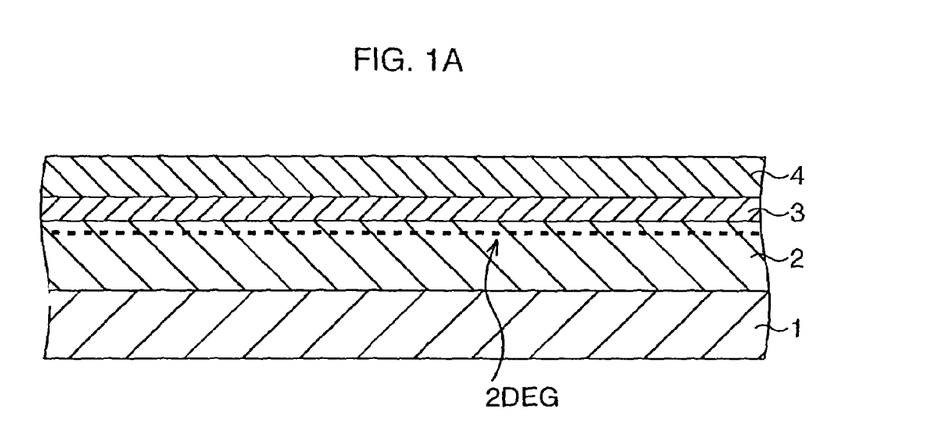
FIGS. 1A to 1G are cross-sectional views showing a manufacturing method for a compound semiconductor device according to an embodiment of the present invention.

In the present embodiment, a GaN buffer layer 2 is first formed as a charge moving layer on a substrate 1 such as a SiC substrate, as shown in FIG. 1A. The GaN buffer layer 2 has a thickness of, for example, about 2 μm. Next, an n-type AlGaN barrier layer 3 is formed as a charge supply layer on the GaN buffer layer 2. The n-type AlGaN barrier layer 3 has a thickness of, for example, about 25 nm. Next, an n-type GaN contact layer 4 is formed on the n-type AlGaN barrier layer 3. The n-type GaN contact layer 4 has a thickness of, for example, about 50 nm.

In the n-type AlGaN barrier layer 3, a piezoelectric effect ascribable to lattice mismatch occurs near an interface with the GaN buffer layer 2. Consequently, positive polarization charge appears, and in the GaN buffer layer 2, electrons are induced near an interface with the n-type AlGaN barrier layer 3. As a result, two-dimensional electron gas (2DEG) is generated.

Figure 1B:
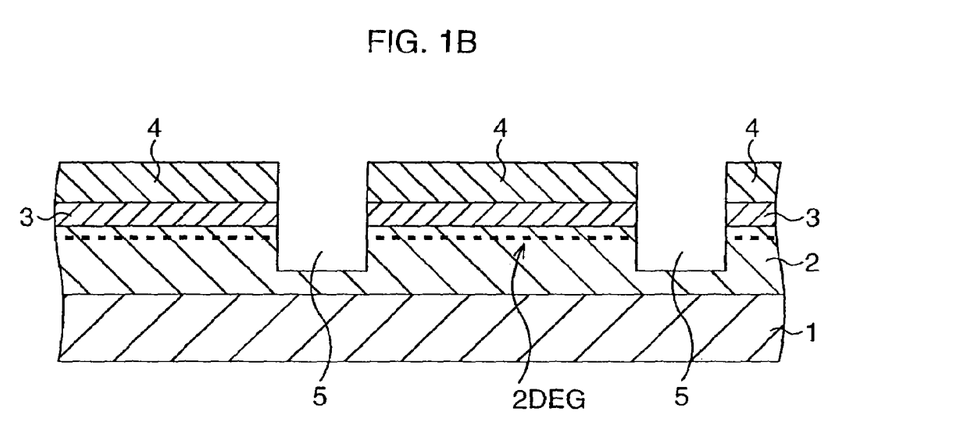

Next, as shown in FIG. 1B, trenches are formed as element isolation regions 5 isolating device regions (regions where semiconductor elements are to be formed) from one another. To form the element isolation regions 5, a resist pattern covering the device regions and having openings formed in its portions corresponding to regions where the element isolation regions 5 are to be formed is first formed on the n-type GaN contact layer 4. Next, with the resist pattern as a mask, dry etching using chlorine gas is performed. At this time, the trenches as the element isolation regions 5 are formed to have a depth so that bottoms thereof are positioned at about the middle of the thickness of the GaN buffer layer 2, for example. That is, if the thickness of the GaN buffer layer 2 is about 2 μm, the depth of the trenches is about 1 μm. Incidentally, the thickness of the n-type AlGaN barrier layer 3 and the thickness of the n-type GaN contact layer 4, which are negligibly small compared with the GaN buffer layer 2, need not be taken into consideration in deciding the depth of the trenches.

Figure 1C:
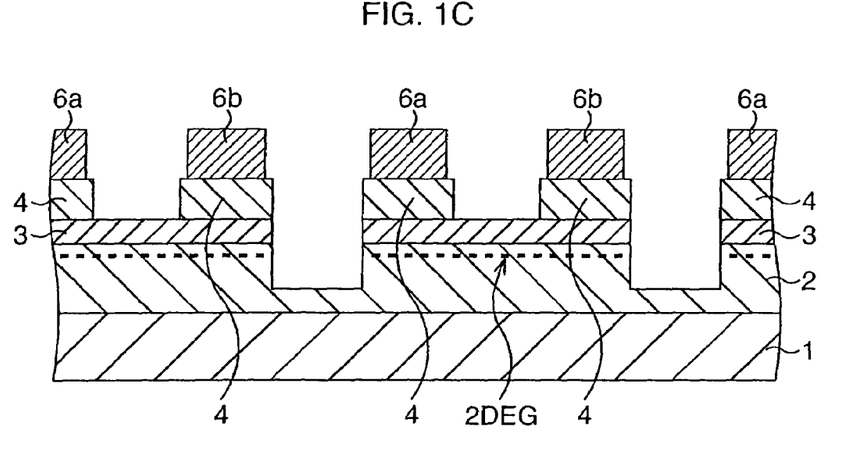

Next, as shown in FIG. 1C, two kinds of ohmic electrodes are formed as source electrodes 6a and drain electrodes 6a respectively on the n-type GaN contact layer 4 in the device regions. As the ohmic electrodes, Ti/Al electrodes are formed, for example. That is, stacks each made up of a Ti film and an Al film thereon are formed.

Figure 1D:
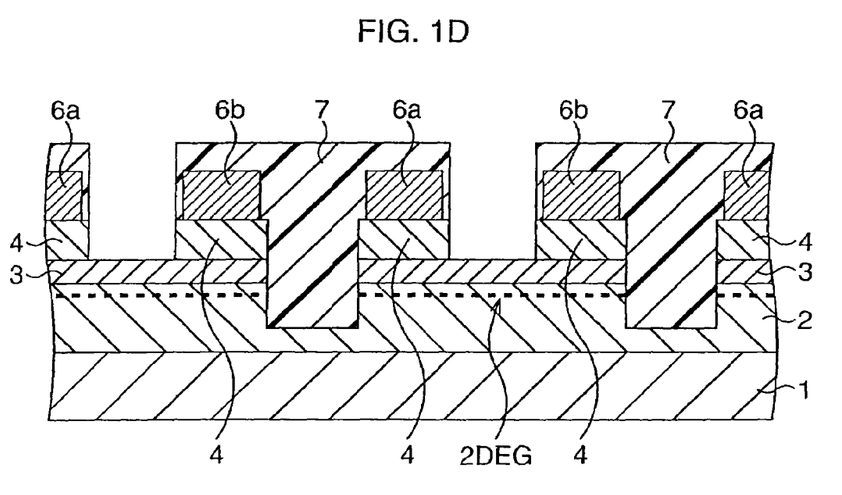

Thereafter, as shown in FIG. 1D, a resist pattern 7 covering the source electrodes 6a and the drain electrodes 6b and having openings corresponding to regions where gate recess structures are to be formed is formed.

Figure 1E:
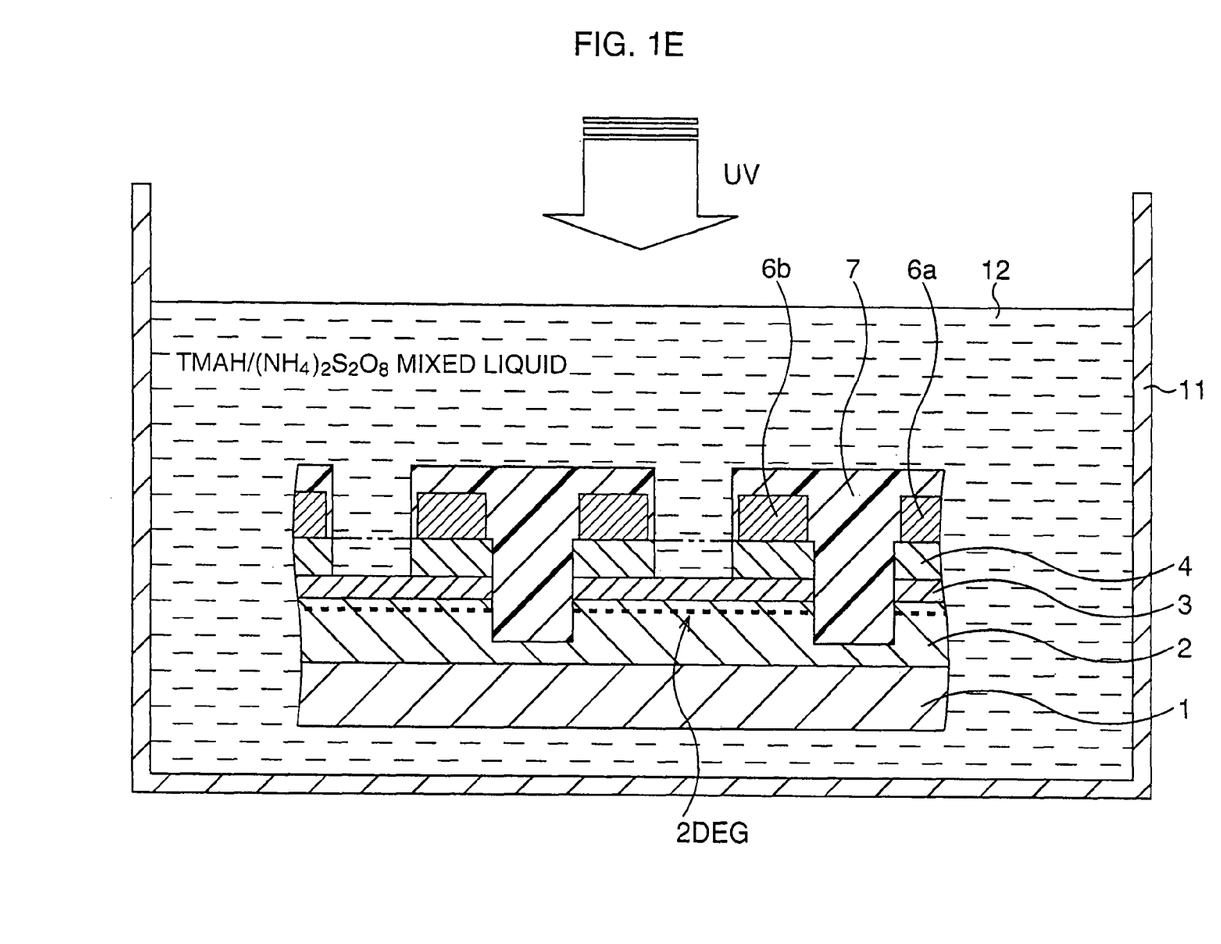

Thereafter, as shown in FIG. 1E, an etching solution 12 is put into an etching tank 11, and the substrate 1, the GaN buffer layer 2, the n-type AlGaN barrier layer 3, and the n-type GaN contact layer 4 are immersed in the etching solution 12. As the etching solution 12, a mixed solution of an organic alkaline agent and an oxidizer is used. As the organic alkaline agent, tetramethylammonium hydroxide (TMAH: $(CH_3)_4NOH$) is usable, for example. As the oxidizer, ammonium peroxodisulfate $((NH_4)_2S_2O_8)$ is usable, for example.

After the substrate 1 and so on are immersed in the etching solution 12, the n-type GaN contact layer 4 is irradiated with an ultraviolet illumination, and at the same time the etching solution 12 is stirred at room temperature in order to prevent uneven etching. Under this condition, the etching rate of the n-type GaN contact layer 4 is about 2.5 nm/minute. Therefore, if the thickness of the n-type GaN contact layer 4 is about 50 nm, the process time may be 20 minutes.

As a result, as shown in FIG. 1E, the portions, of the n-type GaN contact layer 4, not covered by the resist pattern 7 are wet-etched. That is, the gate recess structures are obtained.

Figure 1F:
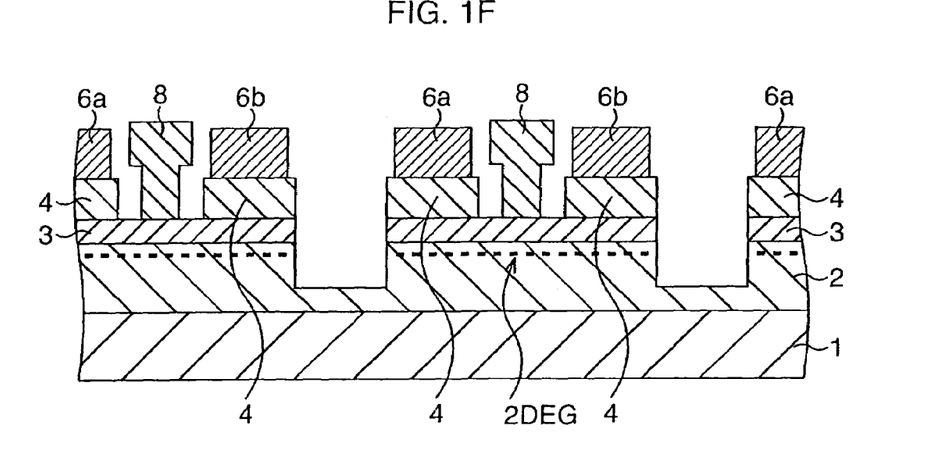

Subsequently, as shown in FIG. 1F, the resist pattern 7 is removed, and Schottky electrodes are formed as gate electrodes 8 in the portions where the gate recess structures are obtained. As the Schottky electrodes, Ni/Au electrodes are formed, for example. That is, stacks each made up of a Ni film and an Au film thereon are formed.

Figure 1G:
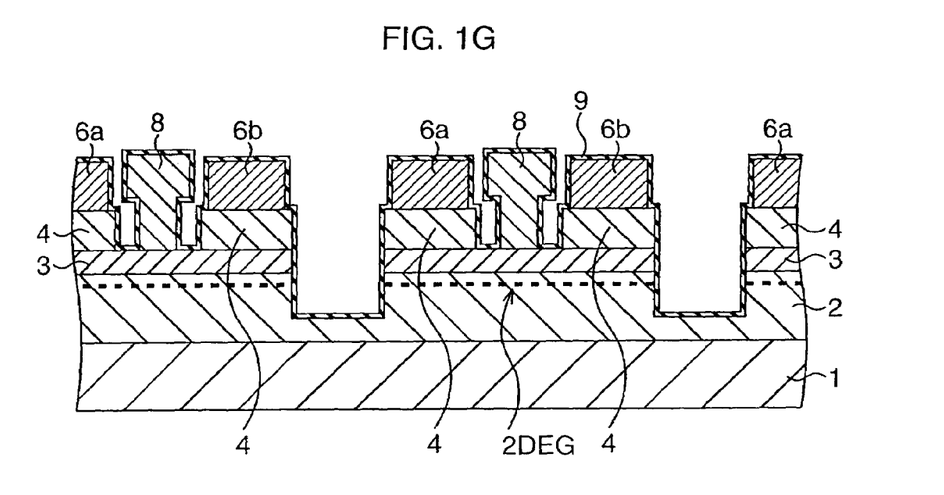

Next, as shown in FIG. 1G, a silicon nitride film 9 is formed as a passivation film on exposed surfaces of the source electrodes 6a, the drain electrodes 6b, the gate electrodes 8, the n-type GaN contact layer 4, and so on.

Thereafter, an interlayer insulation film, wirings, and so on are formed, whereby the compound semiconductor device is completed.

In the present embodiment, the use of the mixed solution of the organic alkali agent and the oxidizer as the etching solution 12 makes it possible to wet-etch the n-type GaN contact layer 4 without applying a bias. Therefore, it is possible to process the n-type GaN contact layer 4 into a desired shape without damaging the n-type AlGaN barrier layer 3 and so on.

Further, since the progress of the wet etching does not rely on the transfer of electrons via the electrodes 6a and 6a, the etching rate is substantially uniform irrespective of the distance from the electrodes 6a and 6b. Further, the concentration of the oxidizer need not be so high as to give an adverse affect to the resist pattern 7. Therefore, the ohmic electrodes (the source electrodes 6a and the drain electrodes 6b) are not corroded.

That is, in-plane uniformity of the etching is improved, processes are simplified, and a resist pattern can be used as an etching mask. These multiplier effects improve a manufacturing yield of a GaN-based electronic device.

Incidentally, as the organic alkali agent of the etching solution, usable other than TMAH is tetraethylammonium hydroxide (($C_2H_5$)$_4$NOH), tetrabutylammonium hydroxide ([$CH_3$($CH_2$)$_3$]$_4$NOH) tetrabutyl-n-propylammonium hydroxide ([$CH_3CH_2CH_2$]$_4$NOH), 2-hydroxyethyl trimethylammonium hydroxide ([($CH_3$)$_3$NCH$_2$CH$_2$OH]OH), trimethyl benzylammonium hydroxide ([$C_6H_5CH_2N(CH_3)$ 3] OH), or the like. Further, as the oxidizer, usable other than ammonium peroxodisulfate is sodium peroxodisulfate ($Na_2S_2O_8$) potassium peroxodisulfate ($K_2S_2O_8$), or the like, which contain peroxodisulfate ions.

The etching solution need not be the perfect mixed solution of the organic alkali agent and the oxidizer, and may contain additives, unavoidable impurities, and the like not causing a problem.

All examples and conditional language recited herein are intended for pedagogical purposes to aid the reader in understanding the principles of the invention and the concepts contributed by the inventor to furthering the art, and are to be construed as being without limitation to such specifically recited examples and conditions, nor does the organization of such examples in the specification relate to a showing of the superiority and inferiority of the invention. Although the embodiments of the present invention have been described in detail, it should be understood that the various changes, substitutions, and alterations could be made hereto without departing from the spirit and scope of the invention.

What is claimed is:

1. A manufacturing method for a compound semiconductor device comprising:
    forming a GaN-based first compound semiconductor layer over a substrate;
    forming a GaN-based second compound semiconductor layer over the first compound semiconductor layer; and
    wet-etching the second compound semiconductor layer with using an etching solution containing an organic alkali agent and an oxidizer while irradiating the second compound semiconductor layer with an ultraviolet illumination.

2. The manufacturing method for a compound semiconductor device according to claim 1, wherein:
    an AlGaN layer is formed as the first compound semiconductor layer; and
    a GaN layer is formed as the second compound semiconductor layer.

3. The manufacturing method for a compound semiconductor device according to claim 2, wherein:
    the organic alkali agent contains at least one kind selected from a group consisting of tetramethylammonium hydroxide, tetraethylammonium hydroxide, tetrabutylammonium hydroxide, tetrabutyl-n-propylammonium hydroxide, 2-hydroxyethyl trimethylammonium hydroxide, and trimethyl benzylammonium hydroxide; and
    the oxidizer contains at least one kind selected from a group consisting of ammonium peroxodisulfate, sodium peroxodisulfate, and potassium peroxodisulfate.

4. The manufacturing method for a compound semiconductor device according to claim 1, further comprising:
    forming a GaN-based channel layer over the substrate, before forming the first compound semiconductor layer, wherein a carrier supply layer is formed as the first compound semiconductor layer over the channel layer.

5. The manufacturing method for a compound semiconductor device according to claim 4, further comprising:
    forming a gate electrode on a portion, of the carrier supply layer, exposed by the wet etching, after said step of wet-etching the second compound semiconductor layer.

6. The manufacturing method for a compound semiconductor device according to claim 5, further comprising:
    forming a source electrode and a drain electrode on the second compound semiconductor layer, between said step of forming the second compound semiconductor layer and said step of wet-etching the second compound semiconductor layer.

7. The manufacturing method for a compound semiconductor device according to claim 6, further comprising:
    forming a resist pattern which covers the source electrode and the drain electrode and from which a portion to be wet-etched of the second compound semiconductor layer is exposed, between said step of forming the source electrode and the drain electrode and said step of wet-etching the second compound semiconductor layer.

8. The manufacturing method for a compound semiconductor device according to claim 7, wherein:
    the organic alkali agent contains at least one kind selected from a group consisting of tetramethylammonium hydroxide, tetraethylammonium hydroxide, tetrabutylammonium hydroxide, tetrabutyl-n-propylammonium hydroxide, 2-hydroxyethyl trimethylammonium hydroxide, and trimethyl benzylammonium hydroxide; and
    the oxidizer contains at least one kind selected from a group consisting of ammonium peroxodisulfate, sodium peroxodisulfate, and potassium peroxodisulfate.

9. The manufacturing method for a compound semiconductor device according to claim 5, wherein:
    the organic alkali agent contains at least one kind selected from a group consisting of tetramethylammonium hydroxide, tetraethylammonium hydroxide, tetrabutylammonium hydroxide, tetrabutyl-n-propylammonium hydroxide, 2-hydroxyethyl trimethylammonium hydroxide, and trimethyl benzylammonium hydroxide; and
    the oxidizer contains at least one kind selected from a group consisting of ammonium peroxodisulfate, sodium peroxodisulfate, and potassium peroxodisulfate.

10. The manufacturing method for a compound semiconductor device according to claim 6, wherein:
    the organic alkali agent contains at least one kind selected from a group consisting of tetramethylammonium hydroxide, tetraethylammonium hydroxide, tetrabutylammonium hydroxide, tetrabutyl-n-propylammonium hydroxide, 2-hydroxyethyl trimethylammonium hydroxide, and trimethyl benzylammonium hydroxide; and
    the oxidizer contains at least one kind selected from a group consisting of ammonium peroxodisulfate, sodium peroxodisulfate, and potassium peroxodisulfate.

11. The manufacturing method for a compound semiconductor device according to claim 4, further comprising:
    forming a source electrode and a drain electrode on the second compound semiconductor layer, between said step of forming the second compound semiconductor layer and said step of wet-etching the second compound semiconductor layer.

12. The manufacturing method for a compound semiconductor device according to claim 11, further comprising:
    forming a resist pattern which covers the source electrode and the drain electrode and from which a portion to be wet-etched of the second compound semiconductor layer is exposed, between said step of forming the source electrode and the drain electrode and said step of wet-etching the second compound semiconductor layer.

13. The manufacturing method for a compound semiconductor device according to claim 12, wherein:
the organic alkali agent contains at least one kind selected from a group consisting of tetramethylammonium hydroxide, tetraethylammonium hydroxide, tetrabutylammonium hydroxide, tetrabutyl-n-propylammonium hydroxide, 2-hydroxyethyl trimethylammonium hydroxide, and trimethyl benzylammonium hydroxide; and
the oxidizer contains at least one kind selected from a group consisting of ammonium peroxodisulfate, sodium peroxodisulfate, and potassium peroxodisulfate.

14. The manufacturing method for a compound semiconductor device according to claim 11, wherein:
the organic alkali agent contains at least one kind selected from a group consisting of tetramethylammonium hydroxide, tetraethylammonium hydroxide, tetrabutylammonium hydroxide, tetrabutyl-n-propylammonium hydroxide, 2-hydroxyethyl trimethylammonium hydroxide, and trimethyl benzylammonium hydroxide; and
the oxidizer contains at least one kind selected from a group consisting of ammonium peroxodisulfate, sodium peroxodisulfate, and potassium peroxodisulfate.

15. The manufacturing method for a compound semiconductor device according to claim 4, wherein:
the organic alkali agent contains at least one kind selected from a group consisting of tetramethylammonium hydroxide, tetraethylammonium hydroxide, tetrabutylammonium hydroxide, tetrabutyl-n-propylammonium hydroxide, 2-hydroxyethyl trimethylammonium hydroxide, and trimethyl benzylammonium hydroxide; and
the oxidizer contains at least one kind selected from a group consisting of ammonium peroxodisulfate, sodium peroxodisulfate, and potassium peroxodisulfate.

16. The manufacturing method for a compound semiconductor device according to claim 1, wherein:
the organic alkali agent contains at least one kind selected from a group consisting of tetramethylammonium hydroxide, tetraethylammonium hydroxide, tetrabutylammonium hydroxide, tetrabutyl-n-propylammonium hydroxide, 2-hydroxyethyl trimethylammonium hydroxide, and trimethyl benzylammonium hydroxide; and
the oxidizer contains at least one kind selected from a group consisting of ammonium peroxodisulfate, sodium peroxodisulfate, and potassium peroxodisulfate.

* * * * *